(12) United States Patent
Jang et al.

(45) Date of Patent: Apr. 20, 2010
(10) Patent No.: US 7,700,966 B2

(54) LIGHT EMITTING DEVICE HAVING VERTICAL STRUCTURE AND METHOD FOR MANUFACTURING THE SAME

(75) Inventors: Jun Ho Jang, Gyeonggi-do (KR); Jun Seok Ha, Seoul (KR)

(73) Assignee: LG Electronics Inc., Seoul (KR)

( * ) Notice: Subject to any disclaimer, the term of this patent is extended or adjusted under 35 U.S.C. 154(b) by 308 days.

(21) Appl. No.: 11/706,977

(22) Filed: Feb. 16, 2007

(65) Prior Publication Data

US 2007/0252165 A1    Nov. 1, 2007

(30) Foreign Application Priority Data

Feb. 16, 2006  (KR) .................. 10-2006-0015037
Feb. 16, 2006  (KR) .................. 10-2006-0015038

(51) Int. Cl.
*H01L 33/00* (2010.01)
(52) U.S. Cl. .................. 257/99; 257/E33.062
(58) Field of Classification Search .................. 257/98, 257/99, E33.006, E33.062, E33.063, E33.064
See application file for complete search history.

(56) References Cited

U.S. PATENT DOCUMENTS

| 5,990,500 | A | 11/1999 | Okazaki | |
|---|---|---|---|---|
| 6,693,352 | B1 | 2/2004 | Huang et al. | |
| 7,148,520 | B2 * | 12/2006 | Yoo | 257/98 |
| 7,268,371 | B2 * | 9/2007 | Krames et al. | 257/98 |
| 2001/0042860 | A1 | 11/2001 | Hata et al. | |
| 2004/0061101 | A1 | 4/2004 | Noto et al. | |
| 2005/0280352 | A1 | 12/2005 | Lai | |
| 2008/0283858 | A1 * | 11/2008 | Jiang et al. | 257/98 |

FOREIGN PATENT DOCUMENTS

DE         196 48 309 A1    7/1997

* cited by examiner

*Primary Examiner*—Mark Prenty
(74) *Attorney, Agent, or Firm*—Birch, Stewart, Kolasch & Birch, LLP

(57) ABSTRACT

A light emitting device having a vertical structure, which includes a semiconductor layer having a first surface and a second surface, a first electrode arranged on the first surface of the semiconductor layer, a transparent conductive oxide (TCO) layer arranged on the second surface of the semiconductor layer and a second electrode arranged on the TCO layer.

14 Claims, 8 Drawing Sheets

Bias Applied

LIGHT EMITTING DEVICE HAVING VERTICAL STRUCTURE AND METHOD FOR MANUFACTURING THE SAME

This application claims the benefit of Korean Patent Application Nos. 10-2006-0015037 and 10-2006-0015038, both filed on Feb. 16, 2006, and which are hereby incorporated by reference in their entirety.

BACKGROUND OF THE INVENTION

1. Field of the Invention

The present invention relates to a light emitting device having a vertical structure, and more particularly to a light emitting device and corresponding manufacturing method having a vertical structure for enhancing a light escape efficiency.

2. Discussion of the Related Art

Light emitting diodes (LEDs) are semiconductor light emitting devices, which convert current into emitted light. For example, a red LED using a GaAsP compound semiconductor has been available since 1962 and is used together with a GaP:N-based green LED as a image display light source in electronic apparatuses.

In addition, the wavelength of light emitted from such an LED depends on the semiconductor material used to fabricate the LED. That is, the wavelength of the emitted light depends on the band gap of the semiconductor material representing an energy difference between the valence-band electrons and the conduction-band electrons.

One example of a semiconductor compound is Gallium nitride (GaN). Further, the GaN compound has been used in LEDs because it is possible to fabricate a semiconductor layer capable of emitting green, blue or white light using the GaN compound in combination with other elements, for example, indium (In), aluminum (Al), etc.

Thus, using GaN in combination with other appropriate elements, it is possible to adjust the wavelength of light to be emitted. Accordingly, when GaN is used, it is possible to appropriately determine the materials of a desired LED in accordance with the characteristics of the apparatus to which the LED is applied. For example, it is possible to fabricate a blue LED useful for optical recording or a white LED for replacing a glow lamp.

On the other hand, initially-developed green LEDs were fabricated using GaP. However, because GaP is an indirect transition material that causes a degradation in efficiency, the green LEDs fabricated using this material cannot produce pure green light. Instead, an InGaN thin film is used to fabricate a high-luminescent green LED.

Also, because of the advantages of GaN-based LEDs, the GaN-based LED market has rapidly grown. In addition, GaN-based LEDs have been developed to exhibit light emission efficiency superior to that of glow lamps. Currently, the efficiency of GaN-based LEDs is substantially equal to that of fluorescent lamps. Thus, it is expected that the GaN-based LED market will grow significantly.

However, despite the rapid advancement in technologies of GaN-based semiconductor devices, the fabrication of GaN-based devices includes high-production costs. This disadvantage is closely related to difficulties associated with growing a GaN thin film (epitaxial layer) and subsequently cutting of the finished GaN-based devices.

In more detail, such a GaN-based device is generally fabricated on a sapphire ($Al_2O_3$) substrate. This is because a sapphire wafer is commercially available in a size suited for mass production of GaN-based devices, supports a GaN epitaxial growth with a relatively high quality, and exhibits a high processability in a wide range of temperatures. Further, sapphire is chemically and thermally stable, and has a high-melting point enabling implementation of a high-temperature manufacturing process.

Also, sapphire has a high bonding energy (122.4 Kcal/mole) and a high dielectric constant. In terms of a chemical structure, the sapphire is a crystalline aluminum oxide ($Al_2O_3$). Meanwhile, because sapphire is an insulating material, available LED devices manufactured using a sapphire substrate (or other insulating substrate) are limited to a lateral or vertical structure.

In the lateral structure, all metal contacts used of injecting electric current into LEDs are positioned on the top surface of the device structure (or on the same substrate surface). On the other hand, in the vertical structure, one metal contact is positioned on the top surface, and the other contact is positioned on the bottom surface of the device after the sapphire (insulating) substrate has been removed.

In addition, a flip chip bonding method has been widely used. In the flip chip bonding method, an inverted LED chip, which has been separately prepared, is attached to a submount of, for example, a silicon wafer or ceramic substrate having an excellent thermal conductivity. However, the lateral structure LED or the LED made using the flip chip method suffers from problems associated with poor heat release efficiency, because the sapphire substrate has a heat conductivity of about 27 W/mK, thus leading to a very high heat resistance. Furthermore, the flip chip method requires several photolithography process steps, thus resulting in complicated manufacturing processes.

Therefore, LED devices having a vertical structure are being used because the sapphire substrate is removed in vertical structure LEDs. In more detail, a laser lift off (LLO) method is used to remove the sapphire substrate. For example, as shown in FIG. 1, a GaN thin film including an n type GaN layer 2, an active layer 3, and a p type GaN layer 4 are formed over a sapphire substrate 1. A p type electrode 5 is also formed over the GaN thin film.

The LLO method is then applied to the chip as fabricated in the above-mentioned manner to completely remove the sapphire substrate 1. In addition, in the LLO method, stress is applied to the GaN thin film upon incidence of a laser beam. Therefore, to separate the sapphire substrate 1 and GaN thin film from each other, a laser beam having a high energy density is used. The laser beam then decomposes the GaN into a metal element, namely, Ga, and a nitrogen gas ($N_2$).

Then, after the substrate 1 is removed, an n type electrode 7 is formed on the exposed n type GaN layer 2, as shown in FIG. 2, to fabricate the vertical LED structure. In addition, as shown in FIG. 2, the n type GaN layer 2 is arranged at the uppermost portion of the chip structure. Therefore, the area of a contact region of the n type GaN layer 2 considerably affects the total light emission efficiency.

In addition, although it is advantageous in terms of light escape to reduce the area of the contact region, there may be a problem such as an increase in the operating voltage, because the reduced contact region causes an increase in the total resistance of the device or insufficient current spreading. Further, because the GaN material has a refractive index of 2.35, the angle through which light from the LED is externally emitted without being fully reflected within the LED is limited to 25° from a vertical line when the GaN material is directly in contact with air having a refractive index of 1.

SUMMARY OF THE INVENTION

Accordingly, one object of the present invention is to provide a light emitting device having a vertical structure and a method for manufacturing the same that substantially obviate one or more problems due to the limitations and disadvantages of the related art.

Another object of the present invention is to provide a vertical structure light emitting device and corresponding manufacturing method having an improved light emission efficiency and light escape efficiency.

To achieve these objects and other advantages and in accordance with the purpose of the invention, as embodied and broadly described herein, the present invention provides in one aspect a light emitting device having a vertical structure, which includes a semiconductor layer having a first surface and a second surface, a first electrode arranged on the first surface of the semiconductor layer, a transparent conductive oxide (TCO) layer arranged on the second surface of the semiconductor layer and a second electrode arranged on the TCO layer.

In another aspect, the present invention provides a light emitting device having a vertical structure, which includes a first electrode, a semiconductor layer arranged on the first electrode, a metal layer having a reactivity to at least one of elements forming the semiconductor layer, a transparent conductive oxide (TCO) layer arranged on the metal layer, and a second electrode arranged on the TCO layer In yet another aspect, the present invention provides A method for manufacturing a light emitting device having a vertical structure. The method includes forming a semiconductor layer having a multilayer structure over a substrate, forming a first electrode on the semiconductor layer, forming a support layer made of metal or semiconductor over the first electrode, separating the substrate from the semiconductor layer, forming a transparent conductive oxide (TCO) layer over a substrate-separated surface of the semiconductor layer, and forming a second electrode on the TCO layer.

Further scope of applicability of the present invention will become apparent from the detailed description given hereinafter. However, it should be understood that the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
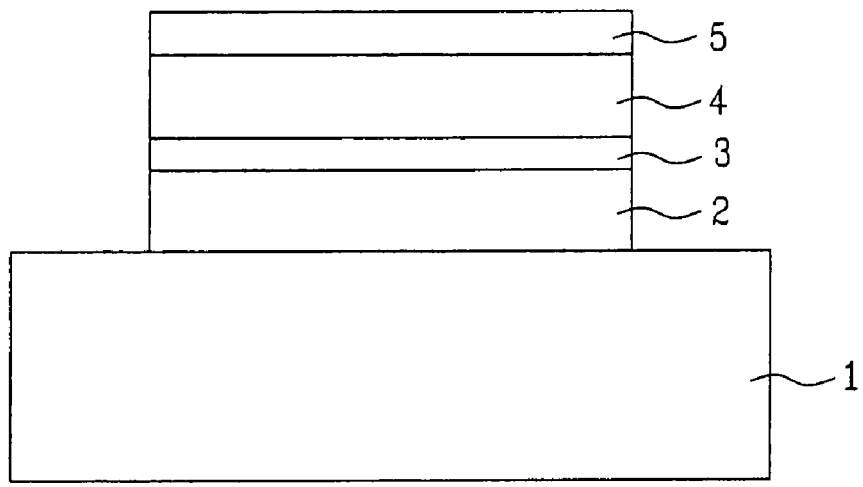
FIG. 1 is a sectional view illustrating a related art process for manufacturing a light emitting device having a vertical structure.
Figure 2:
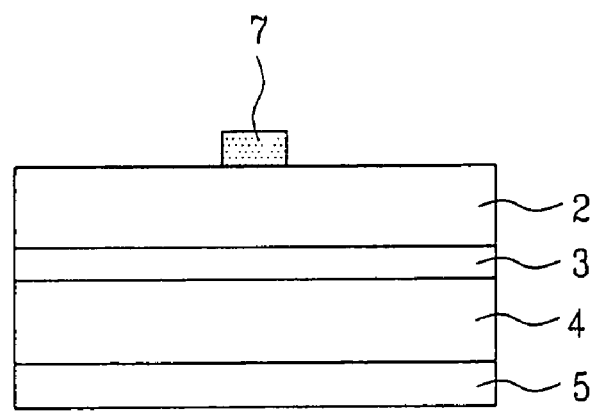
FIG. 2 is another sectional view illustrating the related art light emitting device having a vertical structure.

Reference will now be made in detail to the preferred embodiments of the present invention, examples of which are illustrated in the accompanying drawings. Like numbers refer to like elements throughout the description of the figures. Further, in the drawings, the thickness of layers and regions are exaggerated for clarity.

In addition, when an element such as a layer, region or substrate is referred to as being "on" another element that means it can be directly on the other element or intervening elements may also be present. Further, if part of an element such as a surface is referred to as an "inner" element, this means that it is farther to the outside of the device than other parts of the element.

In addition, relative terms, such as "beneath" and "overlies", are used herein to describe one layer's or region's relationship to another layer or region as illustrated in the figures. However, these terms are intended to encompass different orientations of the device in addition to the orientation depicted in the figures. Also, the term "directly" means that there are no intervening elements. In addition, the term "and/or" includes any and all combinations of one or more of the associated listed items.

Further, although the terms first, second, etc. may be used herein to describe various elements, components, regions, layers and/or sections, these elements, components, regions, layers and/or sections should not be limited by these terms. That is, the terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

First Embodiment

Figure 3:
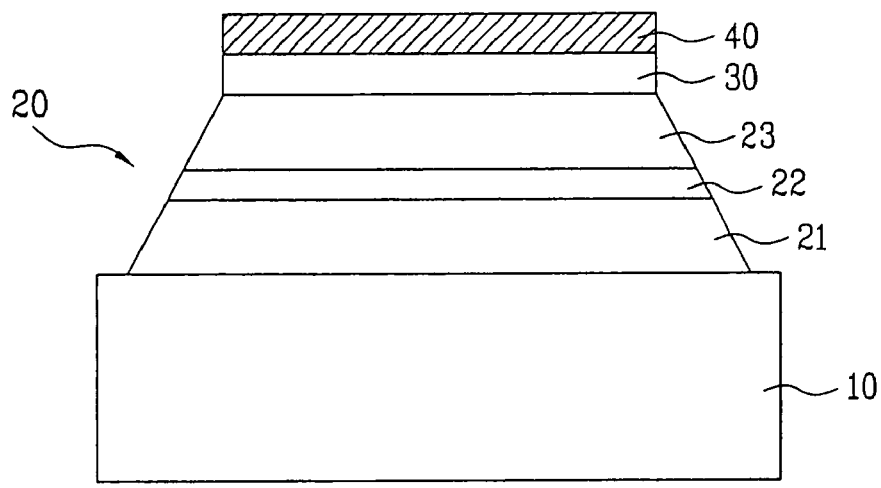
FIG. 3 is a sectional view illustrating an example of a manufacturing process according to an embodiment of the present invention.

Turning now to a description of the first embodiment of the present invention. As shown in FIG. 3, the light emitting device according to this embodiment includes a GaN semiconductor layer 20 having a multilayer structure and a first electrode 30 formed over a sapphire substrate 10.

The semiconductor layer 20 can be grown using a general semiconductor growing method including PVD such as sputtering, MOCVD using an organic metal pre-cursor, and ion implanting may be selectively used in accordance with the convenience of the process. As shown in FIG. 3, the semiconductor layer 20 includes an n type semiconductor layer 21, an active layer 22, and a p type semiconductor layer 23.

Figure 4:
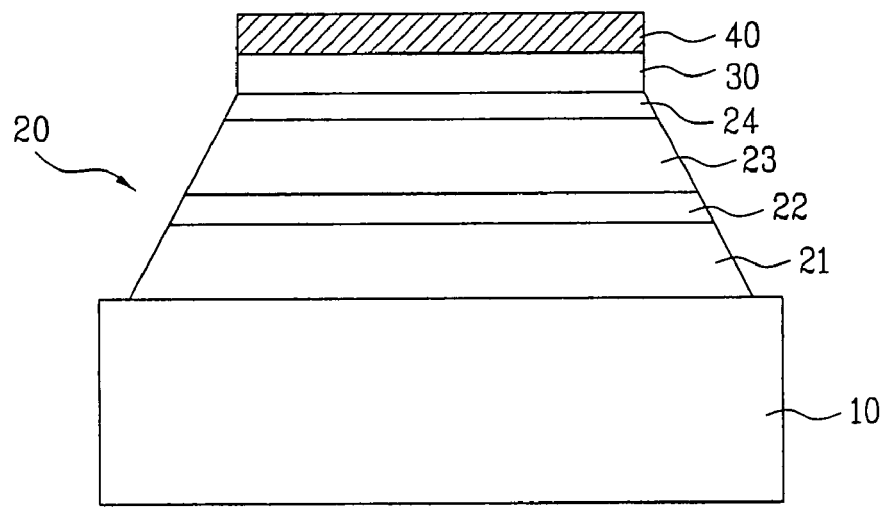
FIG. 4 is a sectional view illustrating another example of the manufacturing process according to an embodiment of the present invention.

Further, as shown, the semiconductor layer 20 may have a structure having an area gradually reduced as it is spaced away from the substrate 10. Also, if necessary, a current diffusion layer 24 may be formed over the p type semiconductor layer 23 as shown in FIG. 4. The current diffusion layer 24 may be an $In_xGa_{1-x}N$ layer or an $In_xGa_{1-x}N$/GaN superlattice layer.

In addition, the current diffusion layer 24 functions to enhance the mobility of carriers, and thus to cause the current to flow smoothly. In this regard, the current diffusion layer is also called a current transport enhanced layer (CTEL). Further, the first electrode 30 may be an ohmic electrode formed using a transparent electrode structure, for example. The first electrode 30 may also be a p type electrode, because it is formed over the p type semiconductor layer 23.

In addition, when a transparent electrode is used for the first electrode 30, as described above, it may be more advantageous to form the transparent electrode 30 over the current diffusion layer 24 using a transparent conductive oxide (TCO). In this structure, the work function of the current diffusion layer 24 may be smaller than the work function of the p type GaN semiconductor layer as the p type semiconductor layer 23, but may be larger than the work function of the transparent electrode 30.

Further, the work function ranges of the diffusion layer 24 and p type semiconductor layer 23 may partially overlap with each other. Also, the work function ranges of the p type semiconductor layer 23 and the transparent electrode 30 may partially overlap with each other. In addition, indium tin oxide (ITO) may be used as a TCO. Other materials, such as indium zinc oxide (IZO), aluminum zinc oxide (AZO), magnesium zinc oxide (MZO), or gallium zinc oxide (GZO) may also be used.

Further, to enhance the reflection efficiency, a reflection electrode 40 may be formed over the first electrode 30. Also, the reflection electrode 40 is preferably made of silver (Ag) or aluminum (Al).

In addition, a support layer may also be provided to support the semiconductor layer 20 when the substrate 10 is removed from the semiconductor layer 20, as will be described later. For example, the support layer may be made of metal or a semiconductor containing Si. Also, when the semiconductor layer 20 has a structure laminated in the above-described order, the first electrode 30 functions as a p type electrode.

In addition, after the light emitting device chip is formed, which includes the semiconductor layer 20, first electrode 30, and reflection electrode 40 formed as described above, the sapphire substrate 10 is completely removed from the light emitting device chip using a laser lift off (LLO) method.

In more detail, in such an LLO method, stress is applied to a GaN-based thin film upon incidence of a laser beam. Further, to separate the sapphire substrate 10 from the GaN thin film, namely the semiconductor layer 20, a laser beam having a high energy density is used. The laser beam decomposes GaN into a metal element, namely, Ga, and nitrogen gas ($N_2$). Further, etching or another type of removing methods may also be used to separate the substrate 10.

Figure 5:
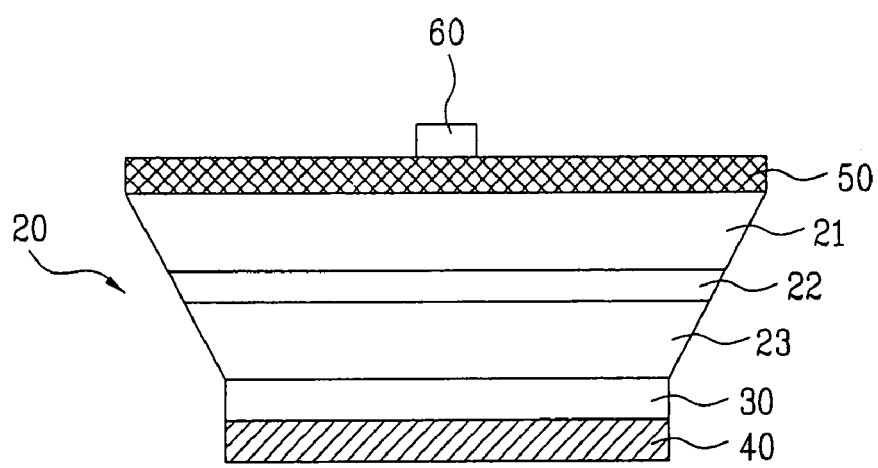
FIG. 5 is a sectional view illustrating an example of a light emitting device having a vertical structure manufactured according to an embodiment of the present invention.

As shown in FIG. 5, after the substrate 10 is removed, a TCO layer 50 is formed over the structure in an inverted state. A second electrode 60 is also formed as a metal pad on the TCO layer 50. The TCO layer 50 functions to efficiently supply current to the semiconductor layer 20. Thus, an enhancement in light emission efficiency, an increase in light emission area, and a decrease in operating voltage is achieved.

That is, because the total resistance of the device does not increase in spite of a reduction in contact region, effective current spreading is achieved. Accordingly, it is possible to decrease the operating voltage. Further, the second electrode 60 is formed in the form of, for example, a metal pad, so as to have a reduced area. Accordingly, the second electrode 60 does not reduce the light emission area.

Meanwhile, as shown in FIG. 5, the semiconductor layer 20 has a structure having an area gradually increasing as it extends from the first electrode 30 to the TCO layer 50. In accordance with this structure, it is possible to increase the light escape angle.

Further, the TCO layer 50 is made of ZnO, for example. Also, AlZnO or InZnO (produced by adding Al or In as a dopant to ZnO) may also be used. In addition, although ITO may be used for the TCO layer 50, the effect of the TCO layer 50 may be low in this instance because the ohmic contact between the TCO layer 50 and the n type semiconductor layer 21 of the semiconductor layer 20 may be insufficiently formed.

Figure 6:
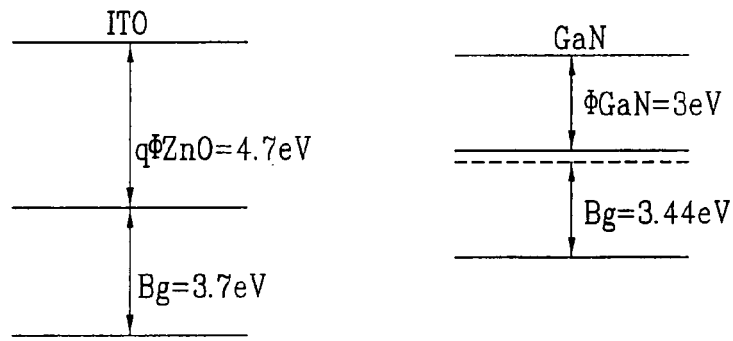
FIG. 6 is a schematic diagram illustrating band structures of ITO and n type GaN.

Turning next to FIG. 6, which illustrates band structures of an ITO and n type GaN semiconductor before the bonding thereof. As shown in FIG. 6, ITO has a work function of about 4.7 eV and a band gap Bg of about 3.7 eV, whereas GaN has a band gap of about 3.44 eV.

Figure 7:
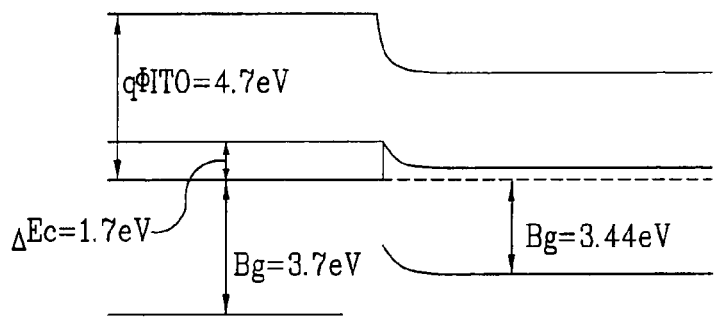
FIG. 7 is a schematic diagram illustrating a band structure formed in a bonded state of ITO and n type GaN.

In addition, as shown in FIG. 7, when ITO and n type GaN semiconductor having the characteristics as described above are bonded, the Fermi level of ITO is equalized with a conduction band, namely, the Fermi level of n type GaN, as in a conductive metal. In this instance, a barrier $\Delta E_c$ is formed that blocks the flow of electrons and has a level of 1.7 eV. That is, the band structure is bent at the bonding surface, so that a barrier is formed in the conduction band at the bonding surface.

Figure 8:
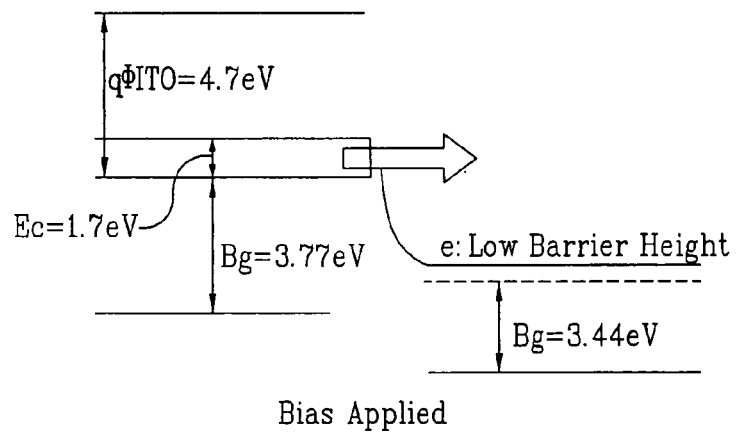
FIG. 8 is a schematic diagram illustrating a band structure formed when an electric field is applied to a bonded structure of ITO and n type GaN.

Thus, when a voltage (bias) is applied to the band structure in this state, the barrier is maintained at 1.7 eV, but the band structure is further bent. Accordingly, as shown in FIG. 8, a tunneling phenomenon occurs at the barrier resulting in current flowing. In this instance, when the applied voltage is increased, an increased amount of current flows because the bending degree increases.

Figure 9:
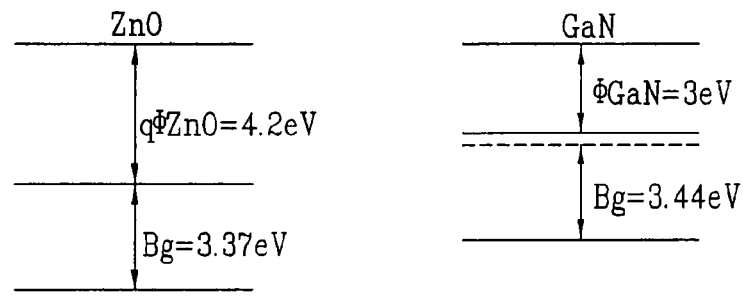
FIG. 9 is a schematic diagram illustrating band structures of ZnO and n type GaN.
Figure 10:
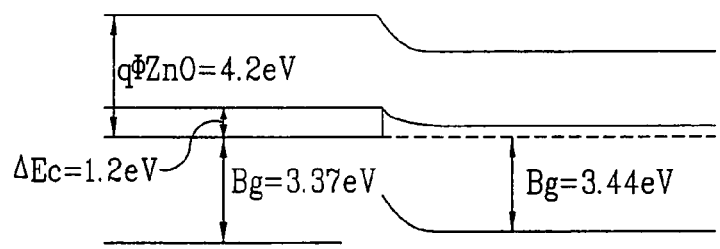
FIG. 10 is a schematic diagram illustrating a band structure formed in a bonded state of ZnO and n type GaN.

In addition, as similar phenomenon occurs when ZnO and n type GaN are bonded. In this instance, as shown in FIG. 9, ZnO has a work function of 4.2 eV and a band gap Bg of 3.37 eV (the work function and band gap are the same for GaN shown in FIG. 6). Further, and as shown in FIG. 10, when ZnO and n type GaN semiconductor having the characteristics described above are bonded, the Fermi level of ZnO is equalized with a conduction band, namely, the Fermi level of n type GaN, as in a conductive metal. In this case, a barrier $\Delta E_c$ is formed that blocks the flow of electrons and has a level of 1.2 eV.

Figure 11:
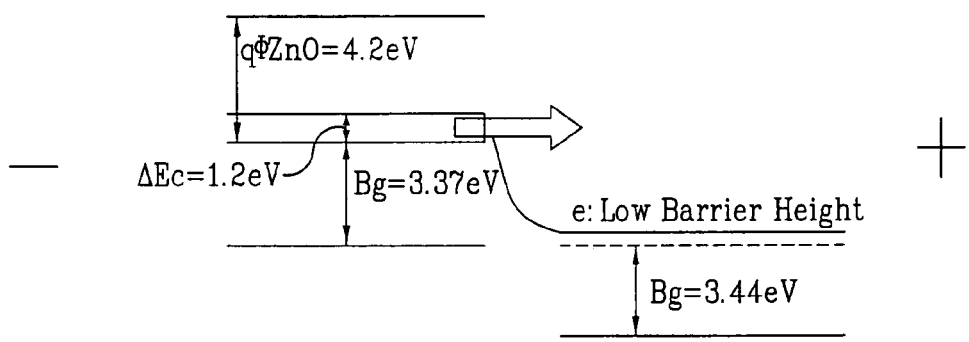
FIG. 11 is a schematic diagram illustrating a band structure formed when an electric field is applied to a bonded structure of ZnO and n type GaN.

Thus, when a voltage (bias) is applied to the band structure in this state, the barrier is maintained at 1.2 eV, but the band structure is further bent. Accordingly, as shown in FIG. 11, a tunneling phenomenon occurs at the barrier resulting in current flowing. In this instance, when the applied voltage is increased, an increased amount of current flows because the bending degree increases.

In addition, because the amount of current flowing in accordance with a tunneling phenomenon is proportional to $\text{Exp}[(\Delta E_c)^{3/2}]$, it is possible to generate a sufficient flow of current with a lower voltage when ZnO and n type GaN are bonded. That is, as can be seen from the above description, when using ZnO or AlZnO or InZnO added with a dopant are more advantageous in terms of the flow of current.

Further, the TCO layer 50 made of a ZnO-based material as described above greatly improves the light escape angle, through which light escapes from the inside of the GaN material. In addition, in accordance with a simple calculation, the light escape angle through which light can directly escape from GaN having a refractive index of 2.35 to the external of the GaN (air) is about 25°. However, when a ZnO-based material is used for the TCO layer 50, the light escape angle is greatly increased because "$\sin^{-1}(2.07/2.35)$" is 61.74°.

Second Embodiment

Turning now to the second embodiment with reference to FIGS. 12 to 15. In the following description, a repeat explanation will not be given of the same process as that of the first embodiment.

Figure 12:
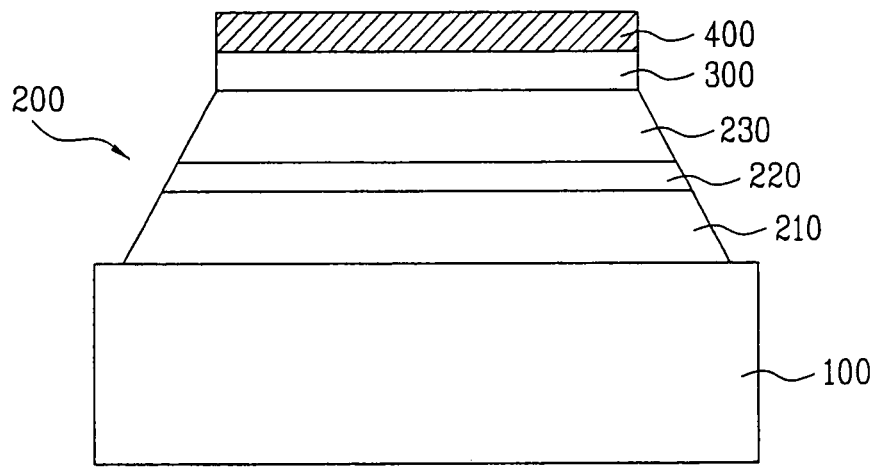
FIG. 12 is a sectional view illustrating an example of a manufacturing process according to an embodiment of the present invention.

First, as shown in FIG. 12, a GaN-based semiconductor layer 200 and a first electrode 300 are formed over a sapphire substrate 100. Further, the semiconductor layer 200 includes an n type semiconductor layer 210, an active layer 220, and a p type semiconductor layer 230. In addition, to achieve an enhancement in reflection efficiency, the first electrode 300 includes a reflection electrode 400. A support layer made of metal or a semiconductor containing Si may also be formed over the first electrode 300.

When the semiconductor layer 200 has a structure laminated in the above-described order, the first electrode 300 functions as a p type electrode. Also, after the light emitting device chip is fabricated as described above, the sapphire substrate 100 is completely removed from the light emitting device chip using a laser lift off (LLO) method.

As discussed above, in the LLO method, stress is applied to a GaN-based thin film upon incidence of a laser beam and a laser beam having a high energy density is used. Further, the laser beam decomposes GaN into a metal element, namely, Ga, and nitrogen gas ($N_2$).

Figure 13:
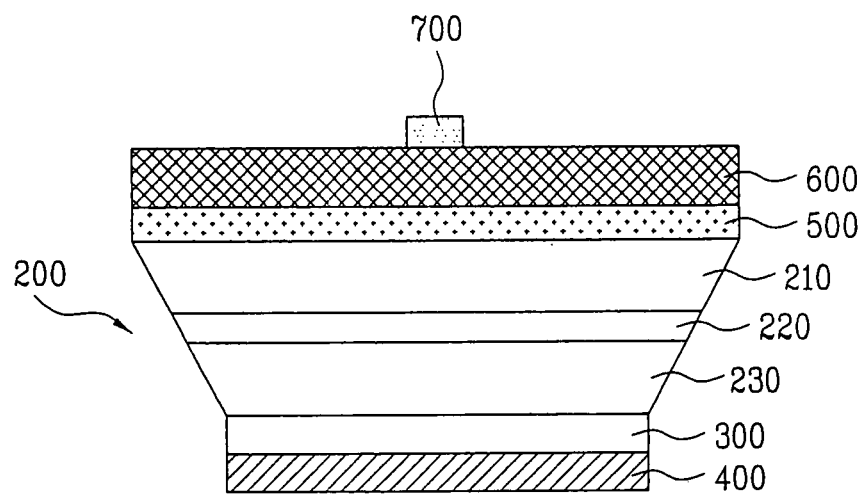
FIG. 13 is a sectional view illustrating an example of a light emitting device having a vertical structure manufactured according to an embodiment of the present invention.

Next, as shown in FIG. 13, a getter metal layer 500 is then deposited over the surface of the n type semiconductor layer 210, from which the substrate 100 has been removed, using a metal having nitrogen gettering characteristics, for example, Ti, Zr, or Cr. The getter metal layer 500 exhibits a high reactivity to nitrogen (N), which is a Group V material in a semiconductor material of Group III to Group V such as GaN.

Further, the deposition of the getter metal such as Ti, Zr, or Cr is achieved by coating or doping the getter metal on or in an interface of the n type semiconductor layer 210 in a small amount. For the deposition method, various methods, for example, PVD such as sputtering, MOCVD using an organic metal pre-cursor, and ion implanting may be selectively used in accordance with the convenience of the process.

Further, as shown in FIG. 13, after the deposition of the getter metal layer 500, a transparent conductive oxide (TCO) layer 600 having an appropriate refractive index is formed over the getter metal layer 500 to obtain a maximum light escape effect. In addition, the TCO layer 600 is preferably made of indium tin oxide (ITO).

Figure 14:
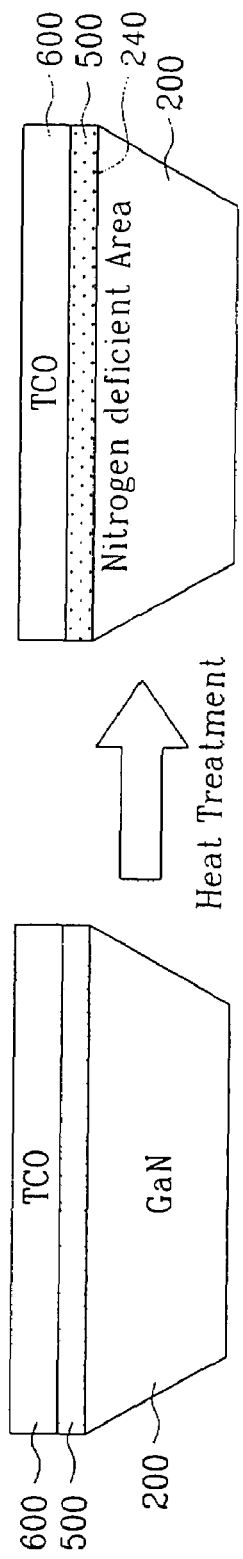
FIG. 14 is a schematic view illustrating a heat treatment process.
Figure 15:
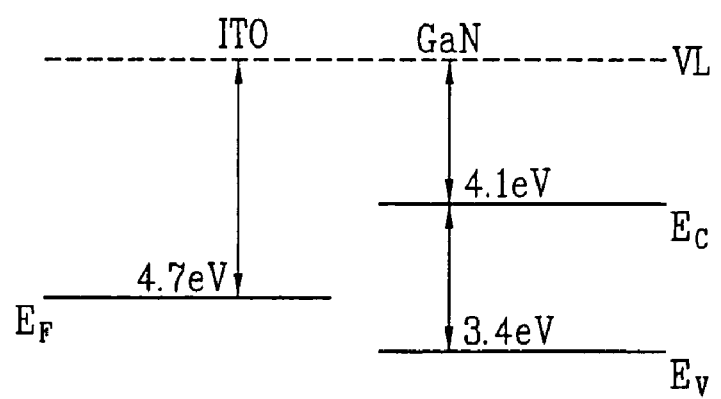
FIG. 15 is a schematic diagram illustrating band structures of ITO and GaN.

Next, as shown in FIG. 14, a heat treatment is performed after the getter metal layer 500 and TCO layer 600 are formed over the semiconductor layer 200. Further, as shown in FIG. 15, TCO such as ITO may not form an effective ohmic contact with any of n type GaN and p type GaN.

However, if the TCO layer 600, which is efficient in terms of refractive index, is applied to a top layer in a light emitting device having a vertical structure, as in the above-described structure, considerable advantages in terms of light escape are achieved. For example, Ga—N decomposition is observed at an ITO/GaN interface in a heat treatment.

In addition, the ohmic contact of n type GaN generally reacts with nitrogen in a Ga—N surface, thereby causing the surface to be nitrogen deficient, and thus forming an ohmic contact. Accordingly, the nitrogen getter metal layer 500 achieves improvements in ohmic characteristics and device stability by removing the nitrogen in the Ga—N structure.

Further, metal such as Ti can effectively prevent a degradation in electrode characteristics caused by formation of a compound, because Ti easily forms a Ti—N compound, and the Ti—N exhibits conductivity characteristics as in metal. In addition, as shown in FIG. 13, after the TCO layer 600 is formed as described above, a second electrode 700 is formed as an n type electrode over the TCO layer 600. Thus, a chip structure is completely fabricated.

Accordingly, it is possible to use ITO as the TCO layer 600. As a result, it is possible to greatly improve the light escape angle, through which light escapes from the inside of the GaN material. Further, using a simple calculation, the light escape angle through which light can directly escape from GaN having a refractive index of 2.35 into the air is about 25°. However, when ITO is used the light escape angle is significantly increased to 54.78°.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A light emitting device having a vertical structure, comprising:
    a semiconductor structure having a first surface and a second surface, the semiconductor structure having inclined surfaces, and the semiconductor structure comprising a p type semiconductor layer, an active layer arranged on the p type semiconductor layer, and an n type semiconductor layer arranged on the active layer;
    a first electrode arranged on the first surface of the semiconductor structure;
    a transparent conductive oxide (TCO) layer arranged on the second surface of the semiconductor structure; and
    a second electrode arranged on the TCO layer.

2. The light emitting device according to claim 1, further comprising:
    a current diffusion layer arranged between the semiconductor structure and the first electrode.

3. The light emitting device according to claim 2, wherein the current diffusion layer comprises an $In_xGa_{1-x}N$ layer or an $In_xGa_{1-x}N$/GaN superlattice layer.

4. The light emitting device according to claim 1, wherein the first electrode comprises a reflection electrode.

5. The light emitting device according to claim 1, further comprising a support layer arranged under the first electrode, the support layer comprising metal or semiconductor containing Si.

6. The light emitting device according to claim 1, wherein the semiconductor structure has an inclined side surface.

7. The light emitting device according to claim 1, wherein the TCO layer comprises a conductive material having a refractive index higher than the refractive index of GaN.

8. The light emitting device according to claim 1, wherein the TCO layer comprises one or more of indium tin oxide (ITO), ZnO, AlZnO, and InZnO.

9. The light emitting device according to claim 1, further comprising a getter metal layer arranged between the semiconductor structure and the TCO layer.

10. The light emitting device according to claim 9, wherein the getter metal layer comprises at least one of Ti, Zr, and Cr.

11. A light emitting device having a vertical structure, comprising:
a first electrode;
a semiconductor structure arranged on the first electrode;
a metal layer having a reactivity to at least one of elements forming the semiconductor structure;
a transparent conductive oxide (TCO) layer arranged on the metal layer; and
a second electrode arranged on the TCO layer.

12. The light emitting device according to claim 11, wherein the first electrode comprises:
a reflection electrode; and
an ohmic electrode arranged between the reflection electrode and the semiconductor structure.

13. The light emitting device according to claim 11, wherein the metal layer comprises at least one of Ti, Zr, and Cr.

14. The light emitting device according to claim 11, wherein the first electrode is formed on a support layer comprising metal or semiconductor containing Si.

* * * * *

UNITED STATES PATENT AND TRADEMARK OFFICE
CERTIFICATE OF CORRECTION

PATENT NO. : 7,700,966 B2
APPLICATION NO. : 11/706977
DATED : April 20, 2010
INVENTOR(S) : Jun Ho Jang et al.

Page 1 of 1

It is certified that error appears in the above-identified patent and that said Letters Patent is hereby corrected as shown below:

ON THE TITLE PAGE:

At item (73), Assignee, change:

"(73) Assignee: LG Electronics Inc., Seoul (KR)"

to

--(73) Assignees: LG Electronics Inc., Seoul (KR); LG Innotek Co., Ltd., Seoul (KR)--

Signed and Sealed this
Thirty-first Day of May, 2011

David J. Kappos
*Director of the United States Patent and Trademark Office*